United States Patent
Tsai et al.

(10) Patent No.: US 9,431,327 B2
(45) Date of Patent: Aug. 30, 2016

(54) SEMICONDUCTOR DEVICE

(71) Applicant: DELTA ELECTRONICS, INC., Taoyuan Hsien (TW)

(72) Inventors: Hsin-Chang Tsai, Taoyuan Hsien (TW); Chia-Yen Lee, Taoyuan Hsien (TW); Peng-Hsin Lee, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 139 days.

(21) Appl. No.: 14/291,563

(22) Filed: May 30, 2014

(65) Prior Publication Data

US 2015/0348889 A1    Dec. 3, 2015

(51) Int. Cl.
*H01L 23/495* (2006.01)
*H01L 25/07* (2006.01)
*H01L 23/00* (2006.01)

(52) U.S. Cl.
CPC ... *H01L 23/49562* (2013.01); *H01L 23/49503* (2013.01); *H01L 23/49524* (2013.01); *H01L 23/49541* (2013.01); *H01L 23/49548* (2013.01); *H01L 23/49575* (2013.01); *H01L 24/34* (2013.01); *H01L 25/072* (2013.01); *H01L 2224/0603* (2013.01); *H01L 2224/32245* (2013.01); *H01L 2224/40245* (2013.01)

(58) Field of Classification Search
CPC .......... H01L 23/49575; H01L 23/49562; H01L 23/49541; H01L 23/49548; H01L 25/072

See application file for complete search history.

(56) References Cited

U.S. PATENT DOCUMENTS

| | | | |
|---|---|---|---|
| 7,619,901 B2* | 11/2009 | Eichelberger | H01L 21/6835 361/763 |
| 7,928,553 B2 | 4/2011 | Otremba et al. | |
| 8,129,227 B2 | 3/2012 | Tellkamp | |
| 8,138,026 B2 | 3/2012 | Abbott | |
| 8,421,204 B2 | 4/2013 | Liu et al. | |
| 2005/0161785 A1* | 7/2005 | Kawashima | H01L 23/49562 257/678 |
| 2006/0056213 A1* | 3/2006 | Lee | H01L 23/4334 363/144 |
| 2008/0316714 A1* | 12/2008 | Eichelberger | H01L 21/6835 361/728 |
| 2009/0189259 A1* | 7/2009 | Mohamed | H01L 23/49524 257/666 |

(Continued)

FOREIGN PATENT DOCUMENTS

| | | |
|---|---|---|
| CN | 101091247 | 12/2007 |
| DE | 102009006152 | 7/2009 |

(Continued)

*Primary Examiner* — Joseph C Nicely
(74) *Attorney, Agent, or Firm* — Hauptman Ham LLP

(57) ABSTRACT

A semiconductor device includes a lead frame, a first semiconductor component, a second semiconductor component, and a first conductive member. The lead frame includes a first segment having a first bottom plate, and a second segment having a second bottom plate. The first segment and the second segment are arranged side by side, the first bottom plate is spatially isolated from the second bottom plate, and the first bottom plate is thicker than the second bottom plate. The first semiconductor component is disposed on the first bottom plate, and the second semiconductor component is disposed on the second bottom plate. The second semiconductor component is thicker than the first semiconductor component. The first conductive member electrically connects the second semiconductor component to the first segment.

19 Claims, 14 Drawing Sheets

(56) References Cited

U.S. PATENT DOCUMENTS

| | | | |
|---|---|---|---|
| 2009/0218666 A1* | 9/2009 | Yang | H01L 21/56 257/677 |
| 2011/0039376 A1* | 2/2011 | Yamashita | H01L 23/3107 438/123 |
| 2012/0181681 A1* | 7/2012 | Cho | H01L 23/49562 257/691 |
| 2012/0208324 A1* | 8/2012 | Harata | H01L 23/49503 438/123 |
| 2012/0256238 A1 | 10/2012 | Ning et al. | |
| 2013/0127031 A1* | 5/2013 | Hosseini | H01L 23/13 257/676 |
| 2014/0284806 A1* | 9/2014 | Luo | H01L 23/49513 257/773 |
| 2014/0374801 A1* | 12/2014 | Ikeda | H01L 23/49575 257/195 |
| 2015/0115458 A1* | 4/2015 | Palm | H01L 24/31 257/774 |
| 2015/0380494 A1* | 12/2015 | Furuhashi | H01L 29/78 257/77 |

FOREIGN PATENT DOCUMENTS

| | | |
|---|---|---|
| EP | 2477221 | 7/2012 |
| EP | 2477222 | 7/2012 |
| JP | 2010161131 | 7/2010 |
| TW | 200805593 | 1/2008 |
| TW | 200939541 | 9/2009 |
| TW | 201001656 | 1/2010 |
| TW | 201125090 | 7/2011 |
| TW | 201309126 | 2/2013 |

* cited by examiner

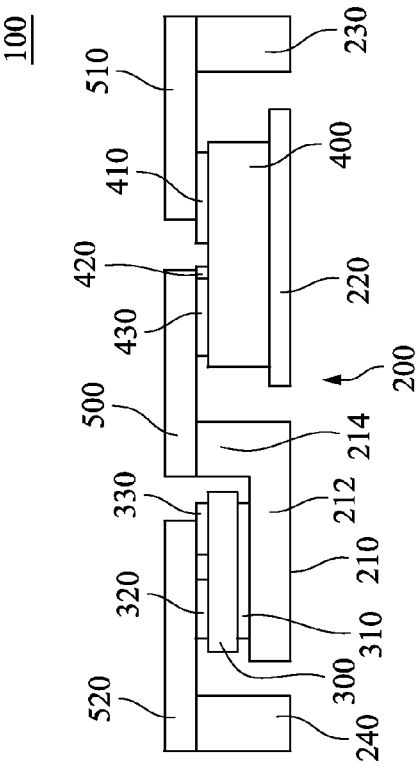
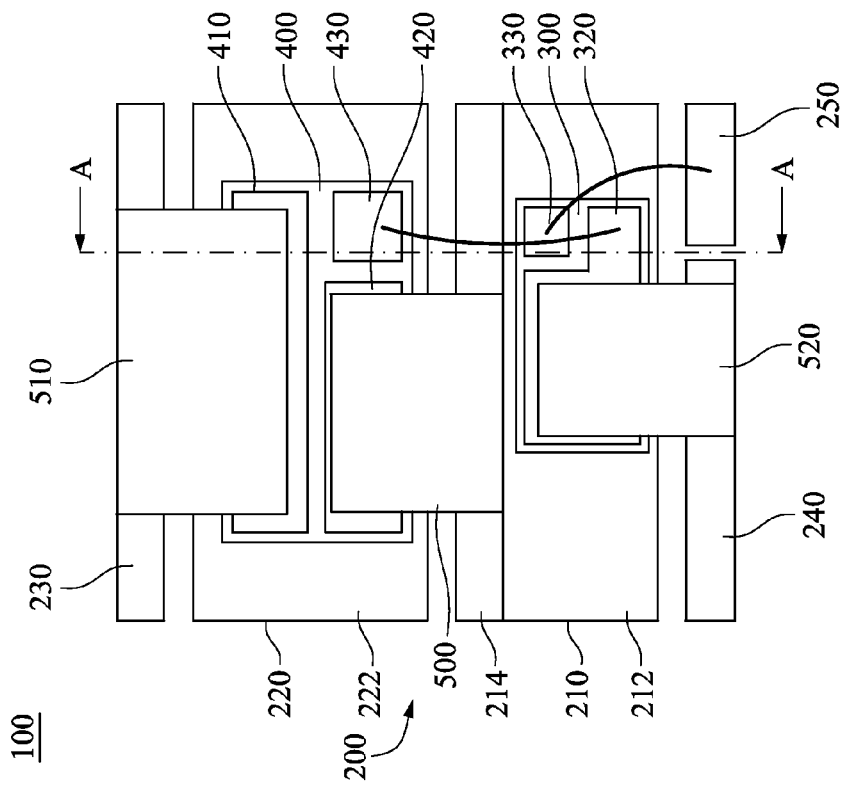
Fig. 1C
Fig. 1D

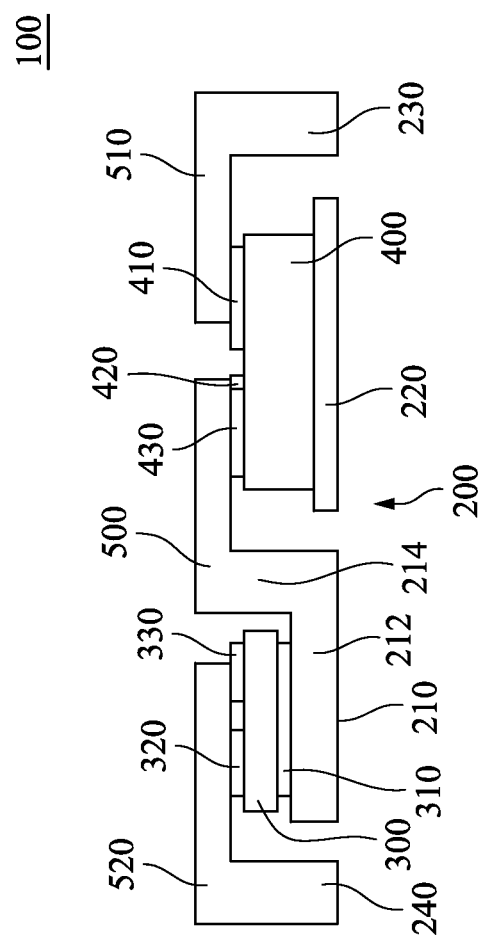

SEMICONDUCTOR DEVICE

BACKGROUND

1. Field of Invention

The present invention relates to a semiconductor device.

2. Description of Related Art

Semiconductor devices are typically fabricated using a process that involves a number of sequential process steps. Recently, market demands have pushed for smaller size and more functions of semiconductor devices.

A semiconductor device, generally speaking, includes a component, or set of components, fabricated onto a wafer that is made of a semiconductor material such as silicon. The wafer in most cases is divided up into a number of dice, which after fabrication will be separated and packaged as components for individual use. Many recently-developed semiconductor devices may contain multiple components, with each components performing its own function either independently or in cooperation with the others. In order to accomplish these functions, the components need to be interconnected.

SUMMARY

The invention provides a semiconductor device including plural semiconductor components.

An embodiment of the invention provides a semiconductor device including a lead frame, a first semiconductor component, a second semiconductor component, and a first conductive member. The lead frame includes a first segment having a first bottom plate, and a second segment having a second bottom plate. The first segment and the second segment are arranged side by side, the first bottom plate is spatially isolated from the second bottom plate, and the first bottom plate is thicker than the second bottom plate. The first semiconductor component is disposed on the first bottom plate, and the second semiconductor component is disposed on the second bottom plate. The second semiconductor component is thicker than the first semiconductor component. The first conductive member electrically connects the second semiconductor component to the first segment.

Another aspect of the semiconductor device includes a lead frame, a first semiconductor component, a second semiconductor component, and a first conductive member. The lead frame includes a first segment and a second segment arranged side by side with the first segment, in which the first segment is spatially isolated from the second segment. The first semiconductor component has a top side and a bottom side. The bottom side of the first semiconductor component is disposed on the first segment. The second semiconductor component has a top side and a bottom side. The second semiconductor component is thicker than the first semiconductor component, and the bottom side of the second semiconductor component is disposed on the second segment. The first conductive member electrically connects the second semiconductor component to the first segment. The top side of the first semiconductor component and the top side of the second semiconductor component are substantially at the same level.

Another aspect of the semiconductor device includes a lead frame, a first semiconductor component, a second semiconductor component, a first conductive member, and a second conductive member. The lead frame includes a first segment and a second segment arranged side by side and being spatially isolated from each other. The first segment has a first pad portion and a second pad portion with a level relatively high compared to a level of the first pad portion, and the first pad portion is thicker than the second segment. The first semiconductor component has a top side and a bottom side, in which the bottom side of the first semiconductor component is disposed on the first pad portion of the first segment. The second semiconductor component has a top side and a bottom side, in which the bottom side of the second semiconductor component is disposed on the second segment. The first conductive member is disposed on the second pad portion of the first segment and the top side of the second semiconductor component. The second conductive member is disposed on the top side of the second semiconductor component. The second conductive member is separated from the first conductive member.

Another aspect of the semiconductor device includes a conductive packaging assembly, a first semiconductor component, and a second semiconductor component. The conductive packaging assembly has a first chamber and a second chamber arranged side by side, in which a depth of the first chamber is smaller than a depth of the second chamber. The first semiconductor component is disposed in the first chamber, and the second semiconductor component is disposed in the second chamber. The second semiconductor component is thicker than the first semiconductor component, and the second semiconductor component is electrically connected to the first semiconductor component via the conductive packaging assembly.

Comparing to using the wire for interconnection, using metal plate as the conductive member for interconnection may reduce the height of the semiconductor device.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 1C is a top view of the semiconductor device as shown in FIG. 1A;

FIG. 1D is a cross-sectional view of the semiconductor device taken along line A-A in FIG. 1C;

FIG. 1E is a cross-sectional view of another embodiment of the semiconductor device taken along line A-A in FIG. 1C;

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
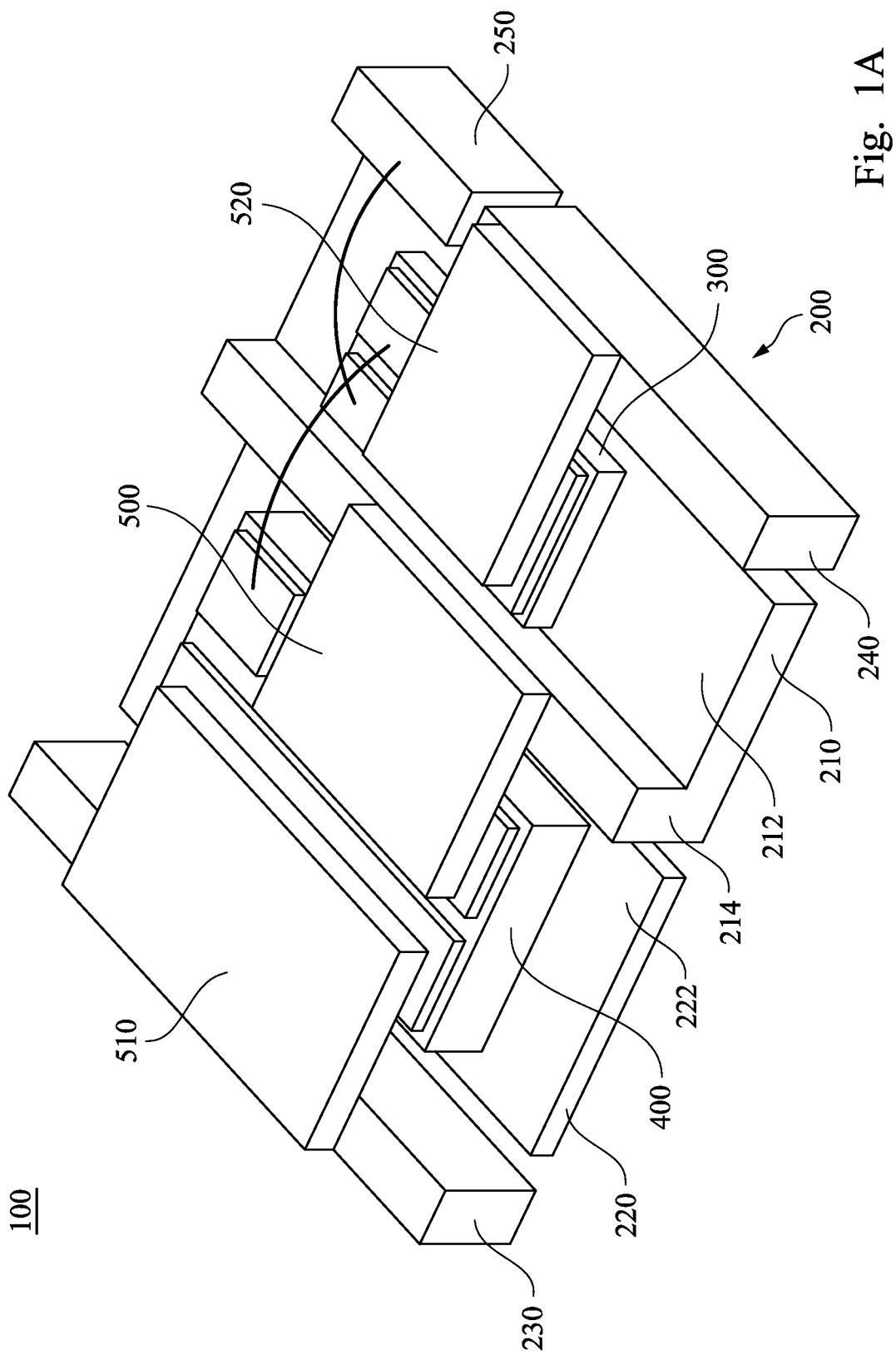
FIG. 1A and FIG. 1B are an oblique view and an explosion view of an embodiment of a semiconductor device of the invention.
Figure 1B:
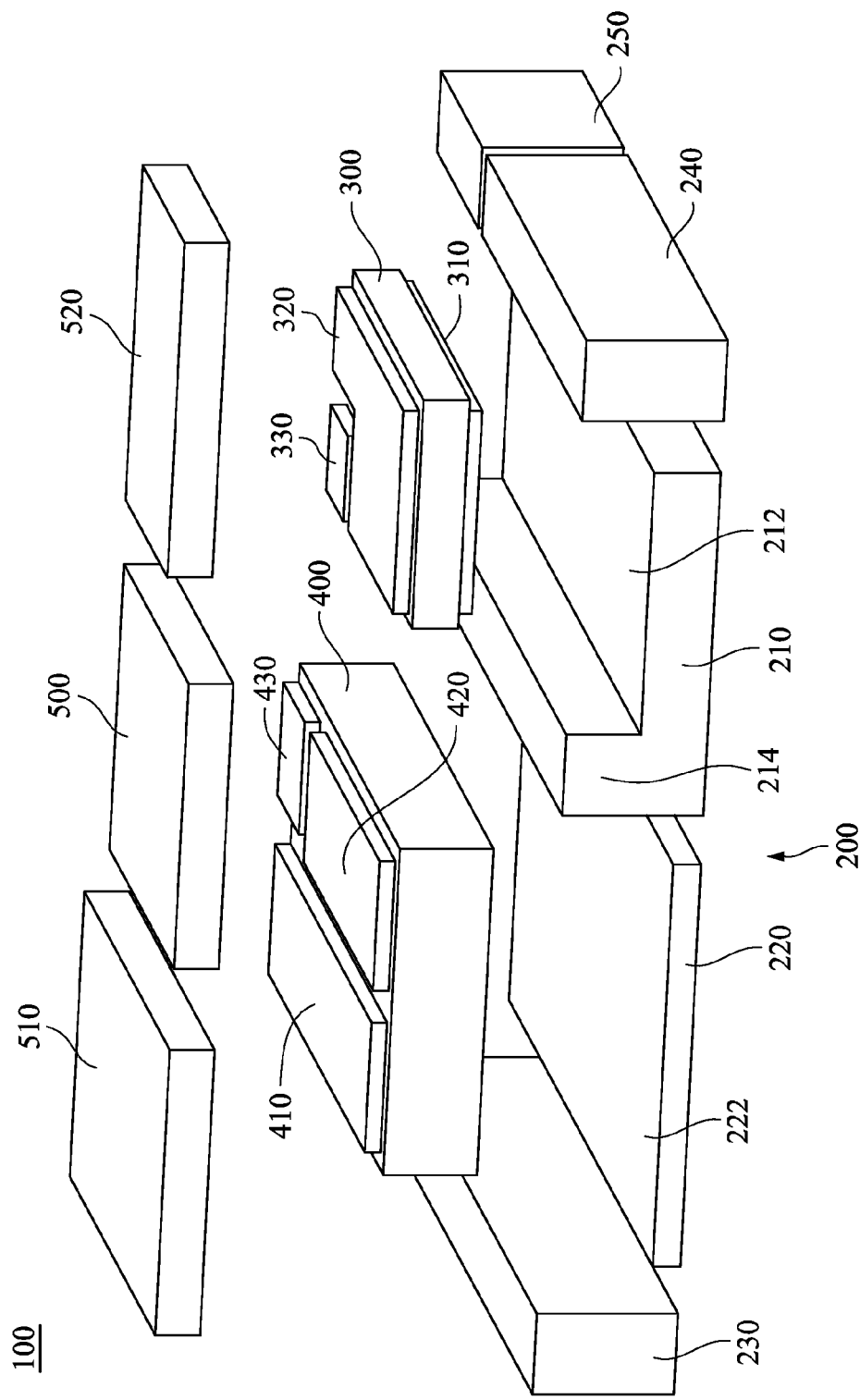

Referring to FIG. 1A to FIG. 1D, FIG. 1A and FIG. 1B are an oblique view and an explosion view of an embodiment of a semiconductor device of the invention; FIG. 1C is a top view of the semiconductor device as shown in FIG. 1A, and FIG. 1D is a cross-sectional view of the semiconductor device taken along line A-A in FIG. 1C.

The semiconductor device 100 includes a lead frame 200, a first semiconductor component 300, and a second semiconductor component 400. The lead frame 200 includes a first segment 210 and a second segment 220. The first segment 210 has a first bottom plate 212, and the second segment 220 has a second bottom plate 222. The first bottom plate 212 is thicker than the second bottom plate 222. The first segment 210 and the second segment 220 are arranged side by side. The first bottom plate 212 is spatially isolated from the second bottom plate 222. The first segment 210 and the second segment 220 are made of metal or alloy.

The second semiconductor component 400 is thicker than the first semiconductor component 300. The first semiconductor component 300 is disposed on and carried by the first bottom plate 212. The second semiconductor component 400 is disposed on and carried by the second bottom plate 222. The sum of the thickness of the first bottom plate 212 and the first semiconductor component 300 is substantially equal to the sum of the thickness of the second bottom plate 222 and the second semiconductor component 400. Namely, the top side of the first semiconductor component 300 and the top side of the second semiconductor component 400 are substantially at the same level.

The first semiconductor component 300 needs to be electrically connected to the second semiconductor component 400 as the semiconductor device 100. The semiconductor device 100 includes a first conductive member 500 for interconnecting the first semiconductor component 300 and the second semiconductor component 400. The first conductive member 500 is a metal plate. Comparing to using the wire for interconnection, using metal plate as the first conductive member 500 may reduce the height of the semiconductor device 100.

The first semiconductor component 300 and the second semiconductor component 400 are connected to each other via first conductive member 500 and the lead frame 200. The first semiconductor component 300 and the second semiconductor component 400 can be a III-V compound semiconductor device, such as a transistor.

In this embodiment, the first semiconductor component 300 can be a vertical component. The first semiconductor component 300 has a first electrode 310, a second electrode 320, and a third electrode 330. The first electrode 310 is arranged at the bottom surface of the first semiconductor component 300, and the second electrode 320 and the third electrode 330 are arranged at the top side of the first semiconductor component 300. The second semiconductor component 400 can be a lateral component. The second semiconductor component 400 has a first electrode 410, the second electrode 420, and the third electrode 430. The first electrode 410, the second electrode 420, and the third electrode 430 are arranged at the top side of the second semiconductor component 400. The first electrodes 310, 410 can be drain electrodes. The second electrodes 320, 420 can be source electrodes. The third electrodes 330, 430 can be gate electrodes.

The lead frame 200 further includes a third segment 230 and a fourth segment 240. The third segment 230 is disposed next to and spatially isolated from the second segment 220. The fourth segment 240 is disposed next to and spatially isolated from the first segment 210. The semiconductor device 100 further includes a second conductive member 510 and a third conductive member 520. The third segment 230 and the fourth segment 240 are made of metal or alloy. The second conductive member 510 and the third conductive member 520 are metal plates. The second conductive member 510 is utilized for electrically connecting the third segment 230 to the second semiconductor component 400. The third conductive member 520 is utilized for electrically connecting the fourth segment 240 to the first semiconductor component 300. The first segment 210 has the first bottom plate 212 and a pad portion 214 connected to the first bottom plate 212. The first bottom plate 212 can be regarded as a first pad portion, and the pad portion 214 can be regarded as a second pad portion. The second pad portion 214 stands on the first pad portion 212 and is arranged between the first pad portion 212 and the second bottom plate 222. The second pad portion 214 has a level relatively high compared to a level of the first pad portion 212, i.e., the second pad portion 214 is protruded from the first pad portion 212.

For instance, the third segment 230 as a terminal is connected to the first electrode 410 of the second semiconductor component 400 via the second conductive member 510. The first electrode 410 is electrically connected to the second electrode 420 within the second semiconductor component 400. The first conductive member 500 connects the second electrode 420 of the second semiconductor component 400 to the second pad portion 214 of the first segment 210. The first semiconductor component 300 is carried by the first bottom plate 212, and the first electrode 310 of the first semiconductor component 300 contacts the first bottom plate 212. The second pad portion 214 is connected to the first pad portion 212, thus the second electrode 420 of the second semiconductor component 400 and the first electrode 310 of the first semiconductor component 300 are interconnected by the first conductive member 500 and the first segment 210. The third conductive member 520 connects the second electrode 320 of the first semiconductor component 300 to the fourth segment 240, in which the fourth segment 240 is utilized as a terminal. The lead frame 200 further includes a fifth segment 250, which is made of metal or alloy, spatially isolated from the first to fourth segments 210-240. The third electrodes 330, 430 can be connected to the fifth segment 250 by clipping a metal plate or a wire bonding. More particularly, after the semiconductor device 100 is sealed by a sealant, at least one of the first segment 210, the second segment 220, the third segment 230, the fourth segment 240, and the fifth segment 250 is at least partially exposed of the sealant as a contact pad for communicating with peripheral.

The bottom sides of the first segment 210, the second segment 220, the third segment 230, the fourth segment 240, and the fifth segment 250 are coplanar arranged. Namely, the bottom sides of the first segment 210, the second segment 220, the third segment 230, the fourth segment 240, and the fifth segment 250 are located at the same level. The first conductive member 500, the second conductive member 510, and the third conductive member 520 are substantially at the same level, and the top sides of the first conductive member 500, the second conductive member 510, and the third conductive member 520 are coplanar arranged.

Referring to FIG. 1E, FIG. 1E is a cross-sectional view of another embodiment of the semiconductor device taken along line A-A in FIG. 1C. In this embodiment, the fourth segment 240 can be unitarily formed with the third conductive member 520; the first conductive member 500 can be unitarily formed with the first segment 210; the second conductive member 510 can be unitarily formed with the third segment 230. Namely, the fourth segment 240 and the third conductive member 520 can be one-piece formed; the first conductive member 500 and the first segment 210 can be one-piece formed; the second conductive member 510 and the third segment 230. can be one-piece formed.

Figure 2:
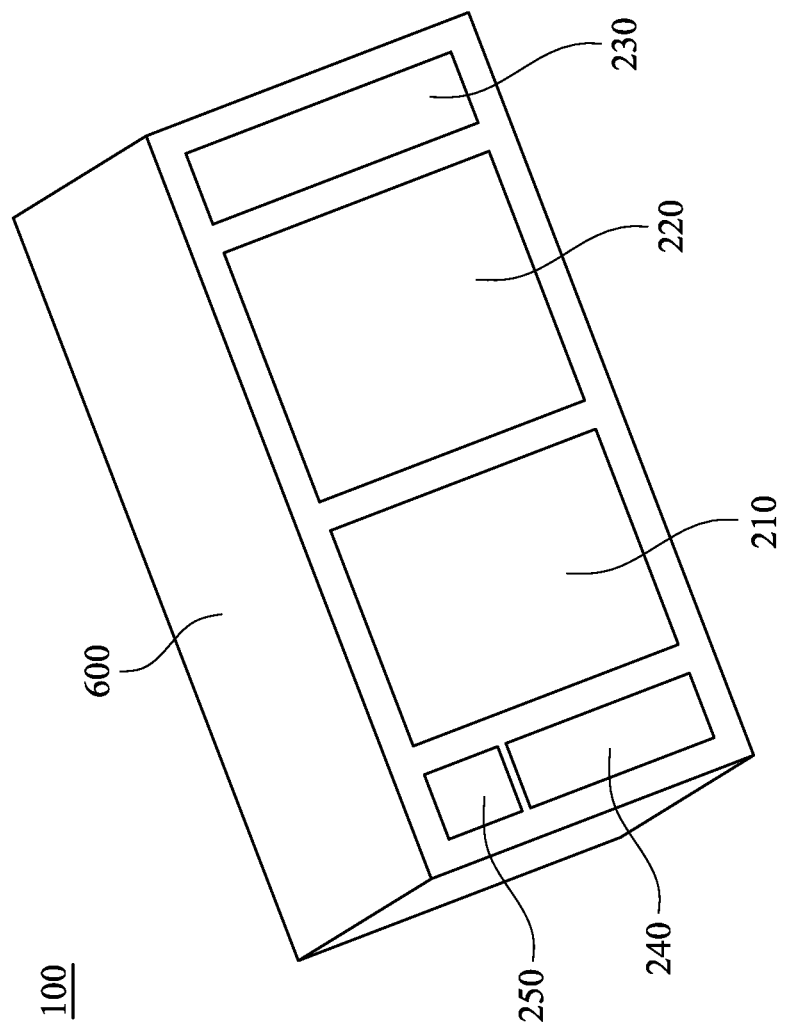
FIG. 2 is a bottom view of another embodiment of the semiconductor device of the invention.

FIG. 2 is a bottom view of another embodiment of the semiconductor device of the invention. After the interconnection process of the semiconductor device 100 as shown in FIG. 1A-1D is done, a sealant 600 is utilized for sealing the first semiconductor component and the second semiconductor component. The lead frame 200 includes the first segment 210, the second segment 220, the third segment 230, the fourth segment 240, and the fifth segment 250. The lead frame 200 is made of metal or alloy. After the first semiconductor component and the second semiconductor component are sealed by the sealant 600, at least one of the first segment 210, the second segment 220, the third segment 230, the fourth segment 240, and the fifth segment 250 is at least partially exposed of the sealant 600 as a contact pad for communicating with peripheral. In this embodiment, the bottom side of the first segment 210, the second segment 220, the third segment 230, the fourth segment 240, and the fifth segment 250 are exposed from the sealant 600. However, in other embodiments, only a few of the first segment 210, the second segment 220, the third segment 230, the fourth segment 240, and the fifth segment 250 or a part of the bottom sides of the first segment 210, the second segment 220, the third segment 230, the fourth segment 240, and the fifth segment 250 are exposed from the sealant 600.

Figure 3A:
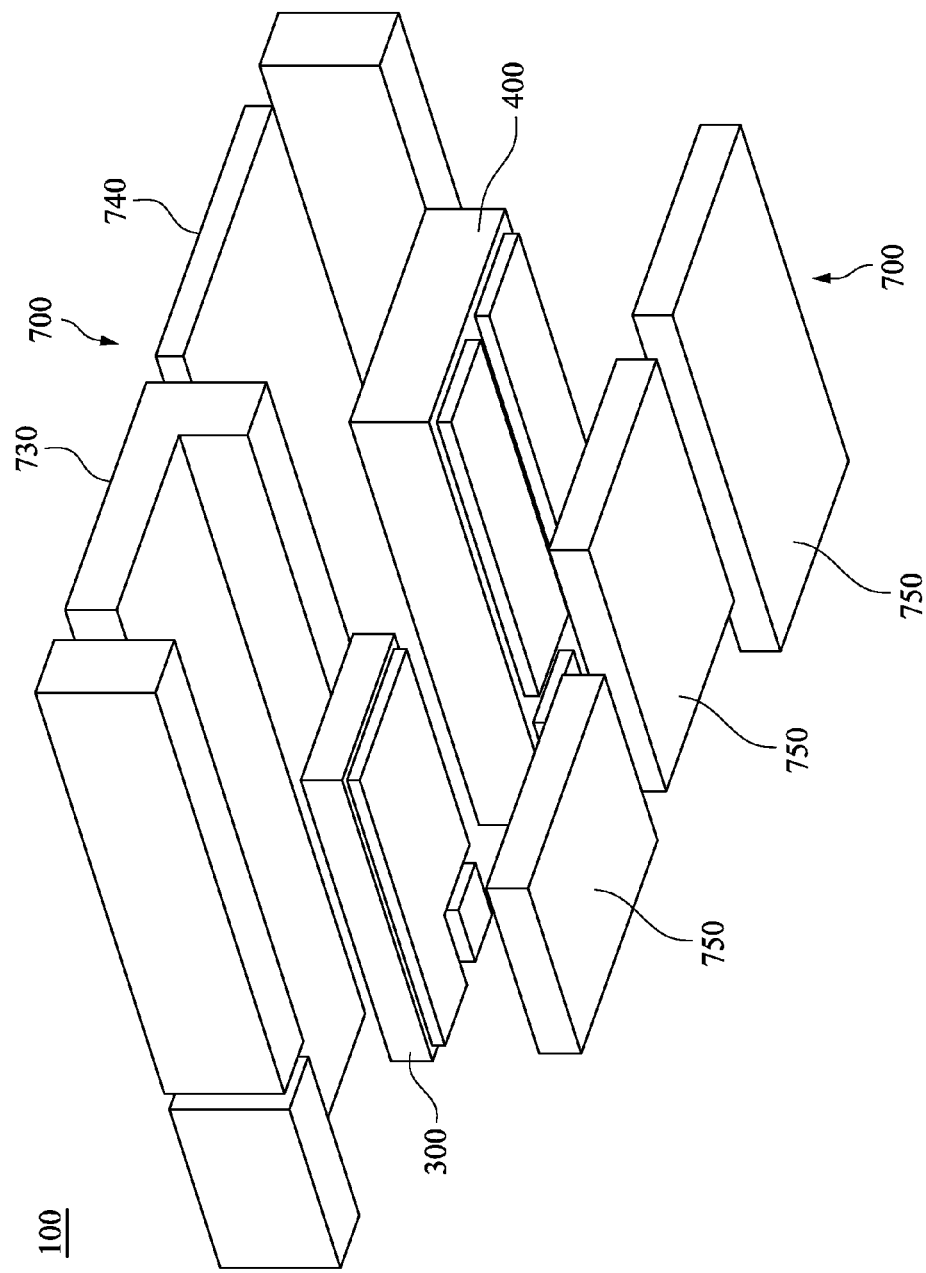
FIG. 3A and FIG. 3B are an explosion view and a side view of another embodiment of the semiconductor device of the invention.
Figure 3B:
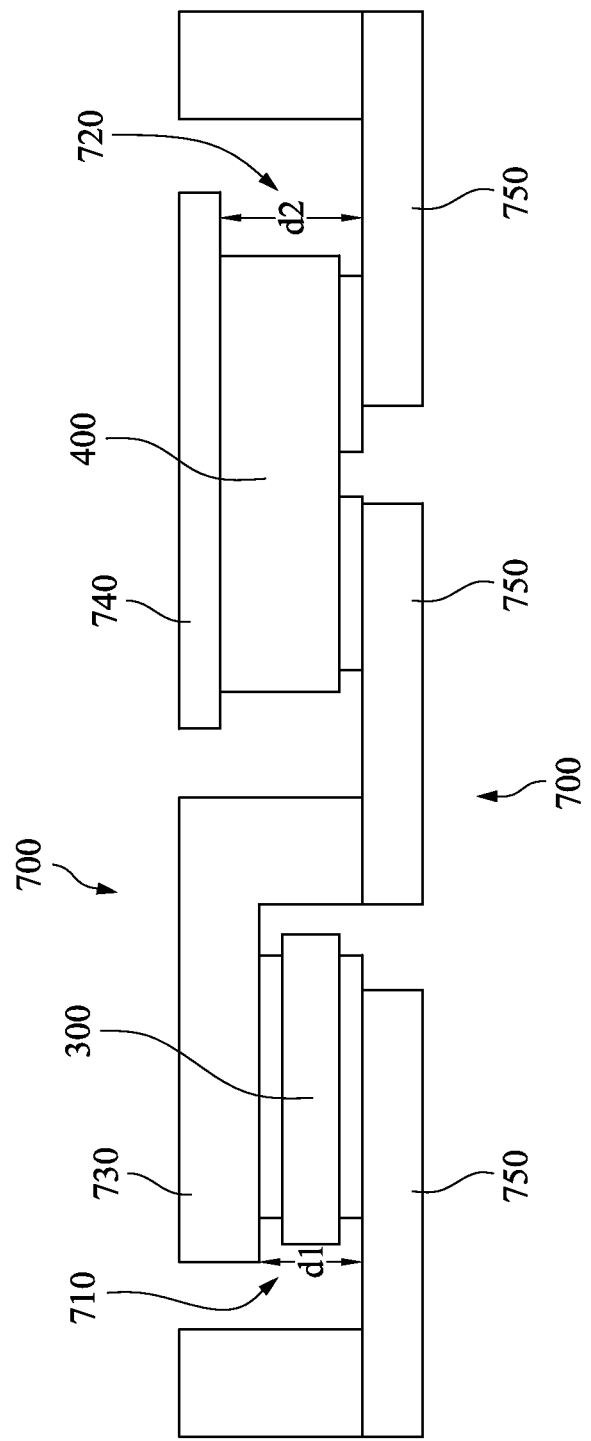

FIG. 3A and FIG. 3B are an explosion view and a side view of another embodiment of the semiconductor device of the invention. The semiconductor device 100 includes the first semiconductor component 300, the second semiconductor component 400, and a conductive packaging assembly 700. The conductive packaging assembly 700 includes a first chamber 710 and a second chamber 720. The first chamber 710 and the second chamber 720 are arranged side by side. The depth d1 of the first chamber 710 is smaller than the depth d2 of the second chamber 720.

The second semiconductor component 400 is thicker than the first semiconductor component 300. The first semiconductor component 300 is disposed in the first chamber 710. The second semiconductor component 400 is disposed in the second chamber 720. The second semiconductor component 400 is electrically connected to the first semiconductor component 300 via the conductive packaging assembly 700.

The conductive packaging assembly 700 includes a first conductive member 730, a second conductive member 740, and a plurality of support members 750. The first conductive member 730 and the second conductive member 740 are disposed at a side of the first chamber 710 and the second chamber 720 and construct a plane. The support elements 750 are disposed at opposite side of the first chamber 710 and the second chamber 720, and the support elements 750 construct another plane.

The first conductive member 730 and second conductive member 740 can be a part of the lead frame. The support elements 750 are utilized for carrying the first semiconductor component 300 and the second semiconductor component 400.

In some embodiments, the first semiconductor component 300 and the second semiconductor component 400 can be supported by the first segment 210 and the second segment 220 (as shown in FIG. 1D); in other embodiments, the first semiconductor component 300 and the second semiconductor component 400 can be supported by the support elements 750 (as shown in FIG. 3B). A sealant can be used for sealing the first semiconductor component 300 and the second semiconductor component 400.

The first conductive member 730, the second conductive member 740, and the support elements 750 include metal plates. The first conductive member 730, the second conductive member 740, and the support elements 750 not only support the first semiconductor component 300 and the second semiconductor component 400, but also electrically connect the first semiconductor component 300 to the second semiconductor component 400.

Figure 3C:
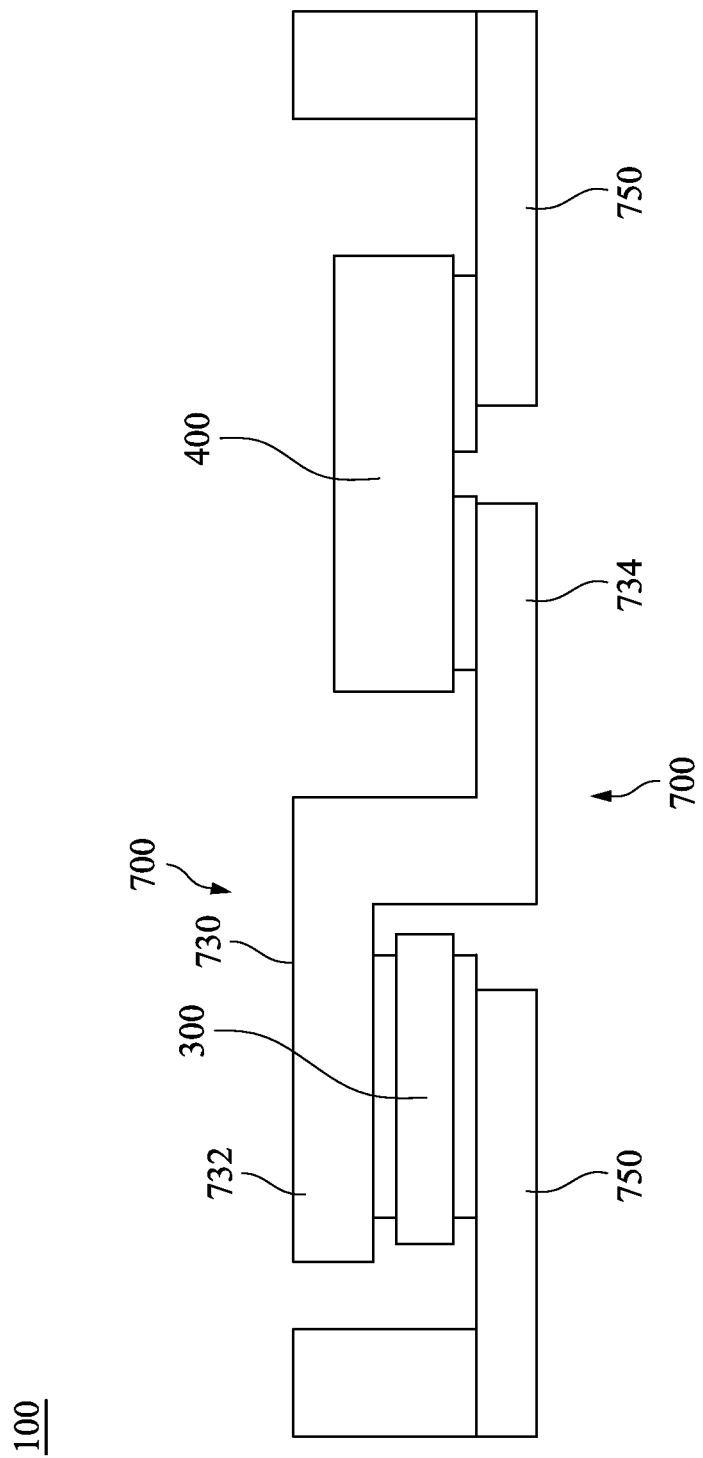
FIG. 3C is a side view of yet another embodiment of the semiconductor device of the invention.

Referring to FIG. 3C, FIG. 3C is a side view of yet another embodiment of the semiconductor device of the invention. In this embodiment, the first support element 730 includes a plate portion 734 and an electrode portion 732. The plate portion 734 has one end coupled to the bottom side of the second semiconductor component 400. The electrode portion 732 is extended from another end of the plate portion 734, and is electrically connected to the top side of the first semiconductor component 300. The plate portion 734 is unitarily formed with the electrode portion 732. Also, the second conductive member 720 (as shown in FIG. 3B) can be omitted in this embodiment.

Figure 4A:
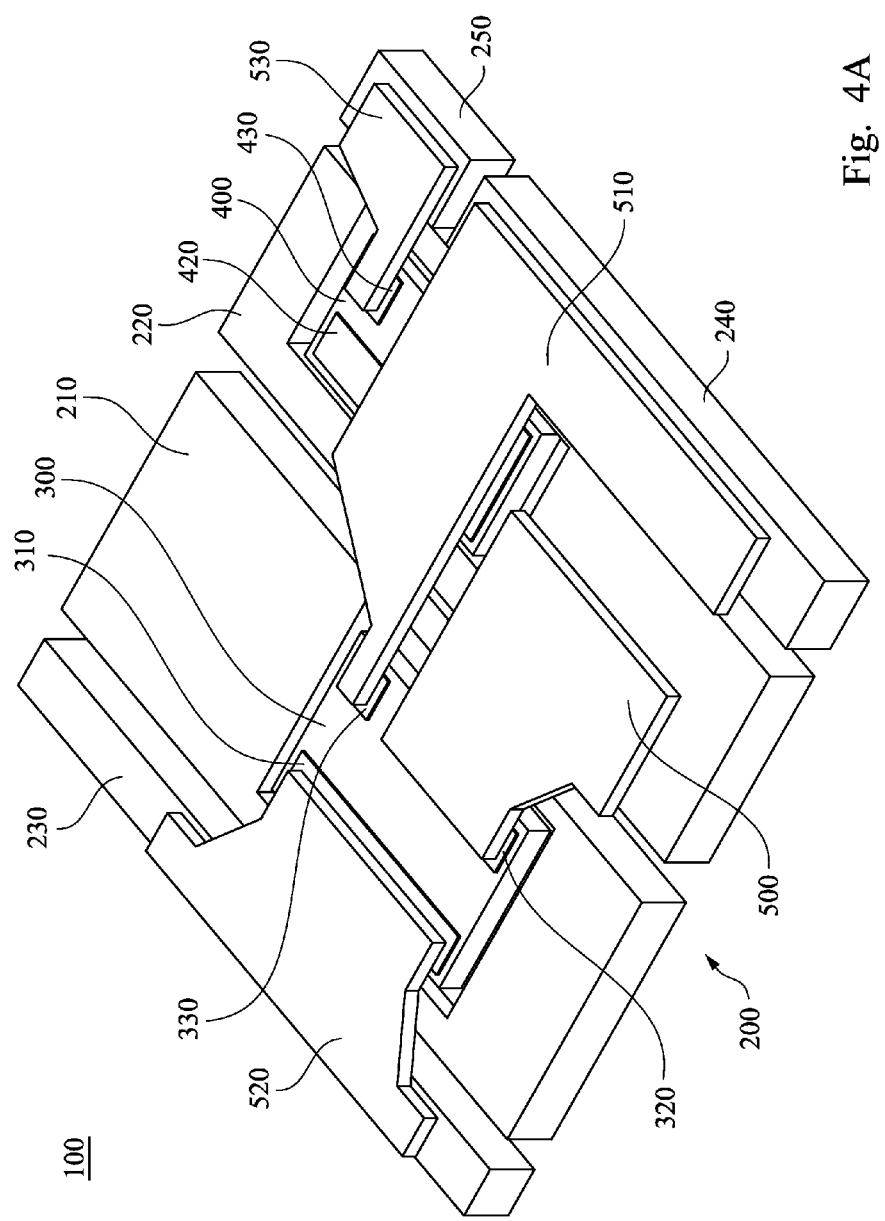
FIG. 4A and FIG. 4B are an oblique view and a cross-sectional view of another embodiment of the semiconductor device of the invention.
Figure 4B:
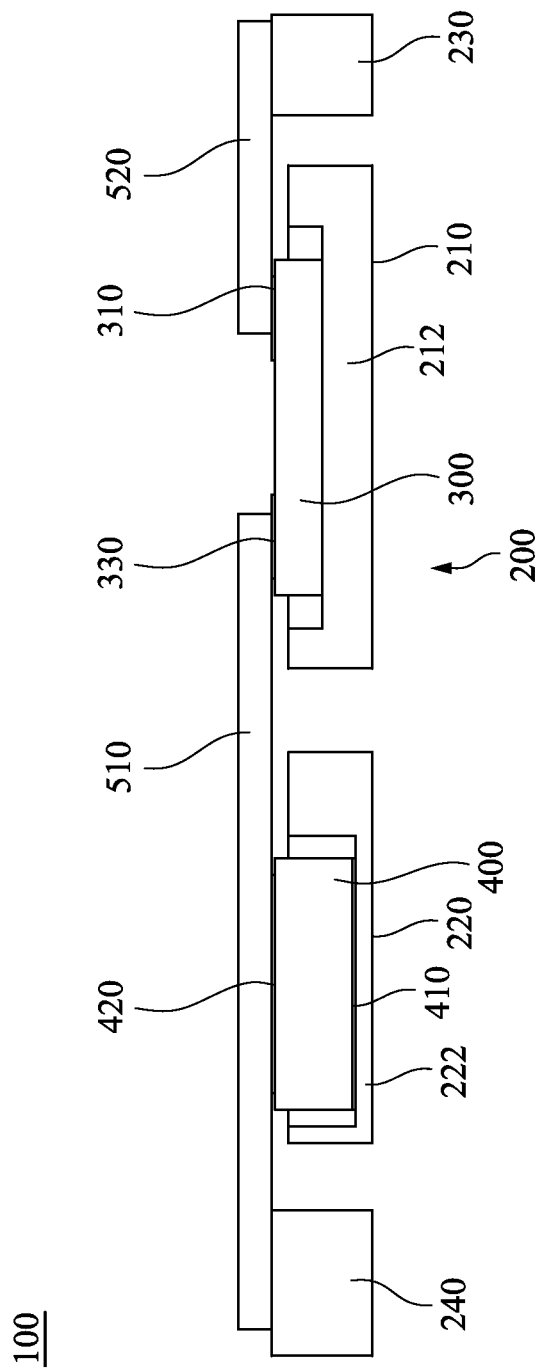

Reference is made to FIG. 4A and FIG. 4B. FIG. 4A and FIG. 4B are an oblique view and a cross-sectional view of another embodiment of the semiconductor device of the invention. The semiconductor device 100 includes the lead frame 200, the first semiconductor component 300, the second semiconductor component 400, and a plurality of conductive members 500, 510, 520, and 530.

The lead frame 200 includes the first segment 210, the second segment 220, the third segment 230, the fourth segment 240, and the fifth segment 250. The first segment 210 and the second segment 220 are arranged side by side, and a part of the first bottom plate 212 of the first segment 210 is thicker than a part of the second bottom plate 222 of the second segment 220. The third segment 230 is arranged next to and spatially isolated from the first segment 210. The fourth segment 240 and the fifth segment 250 are arranged next to and spatially isolated from second segment 220. The fourth segment 240 and the fifth segment 250 are spatially isolated from each other.

The first semiconductor component 300 can be a lateral component. The first semiconductor component 300 has the first electrode 310, the second electrode 320, and the third electrode 330 arranged at the same side of the first semiconductor component 300. The second semiconductor component 400 can be a vertical component. The second semiconductor component 400 has the first electrode 410 arranged at one side of the second semiconductor component 400, and the second electrode 420 and the third electrode 430 arranged at opposite side of the second semiconductor component 400. The first semiconductor component 300 is thinner than the second semiconductor component 400. The first semiconductor component 300 is disposed on the part of the first bottom plate 212 of the first segment 210. The second semiconductor component is disposed on the part of the second bottom plate 222 of the second segment 220. The first electrode 410 of the second semiconductor component 400 contacts the second segment 220.

The conductive members 500, 510, 520, and 530 are flat metal plates. The conductive members 500, 510, 520, and 530 and the lead frame 200 are utilized for interconnecting the first semiconductor component 300 and the second semiconductor component 400 and for connecting the semiconductor device 100 to peripheral. The conductive member 500 connects the second electrode 320 of the first semiconductor component 300 to the second segment 220. The conductive member 510 connects the third electrode 330 of the first semiconductor component 300 to the second electrode 420 of the second semiconductor component 400 and the fourth segment 240. The conductive member 520 connects the third segment 230 to the first electrode 310 of the first semiconductor component 300. The conductive member 530 connects the third electrode 430 of the second semiconductor component 400 to the fifth segment 250.

Figure 5A:
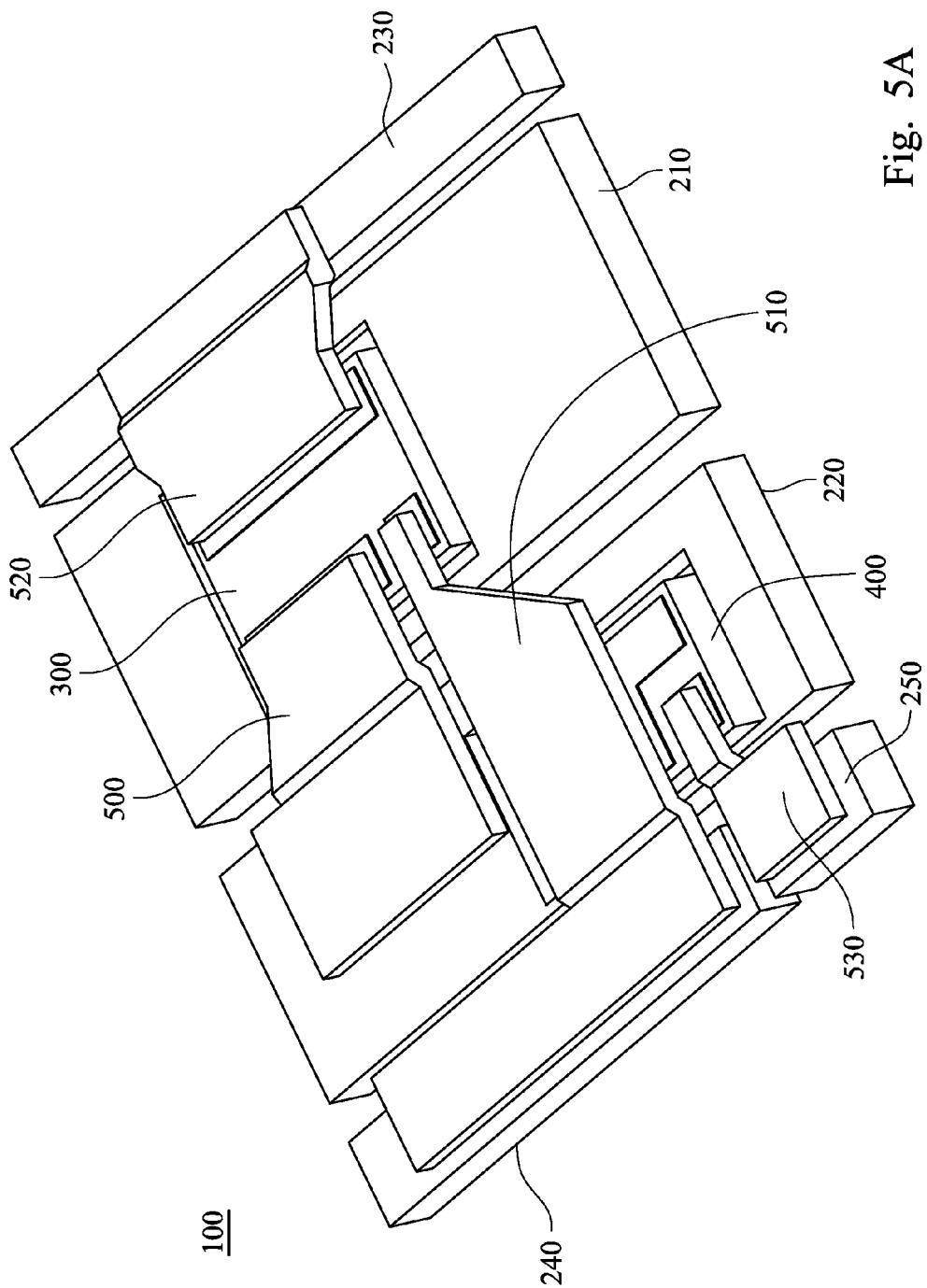
FIG. 5A and FIG. 5B are an oblique view and a cross-sectional view of another embodiment of the semiconductor device of the invention.
Figure 5B:
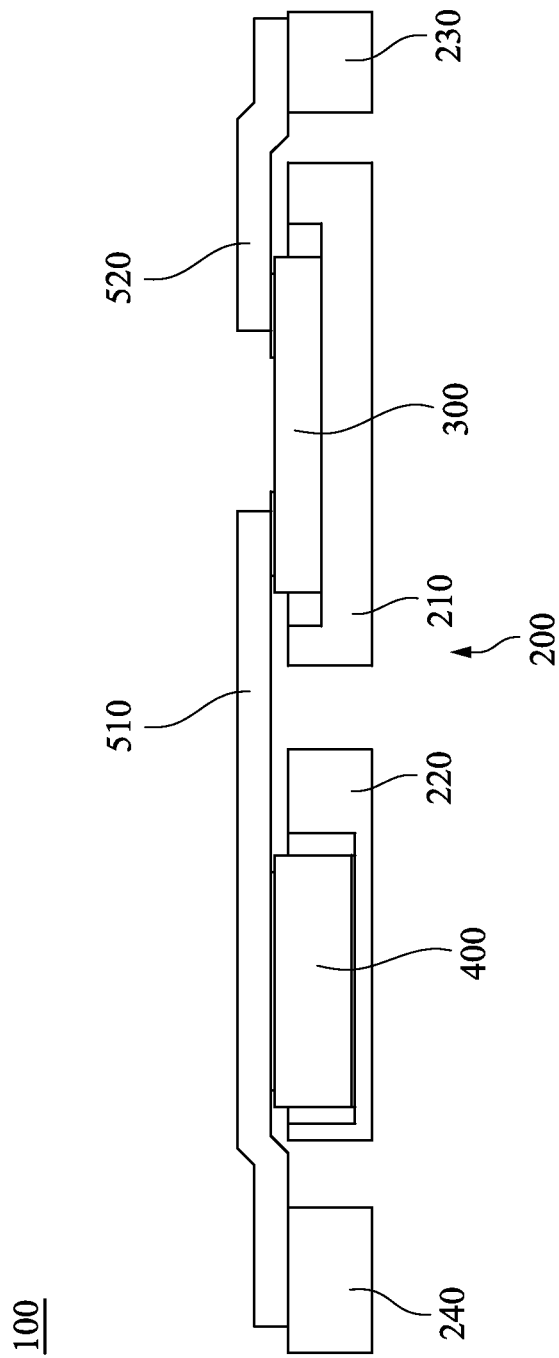

Reference is made to FIG. 5A and FIG. 5B. FIG. 5A and FIG. 5B are an oblique view and a cross-sectional view of another embodiment of the semiconductor device of the invention. The semiconductor device 100 includes the lead frame 200, the first semiconductor component 300, the second semiconductor component 400, and a plurality of conductive members 500, 510, 520, and 530. The difference between this embodiment and the previous embodiment is that the conductive members 500, 510, 520, and 530 are metal plates with drop sections.

Figure 6A:
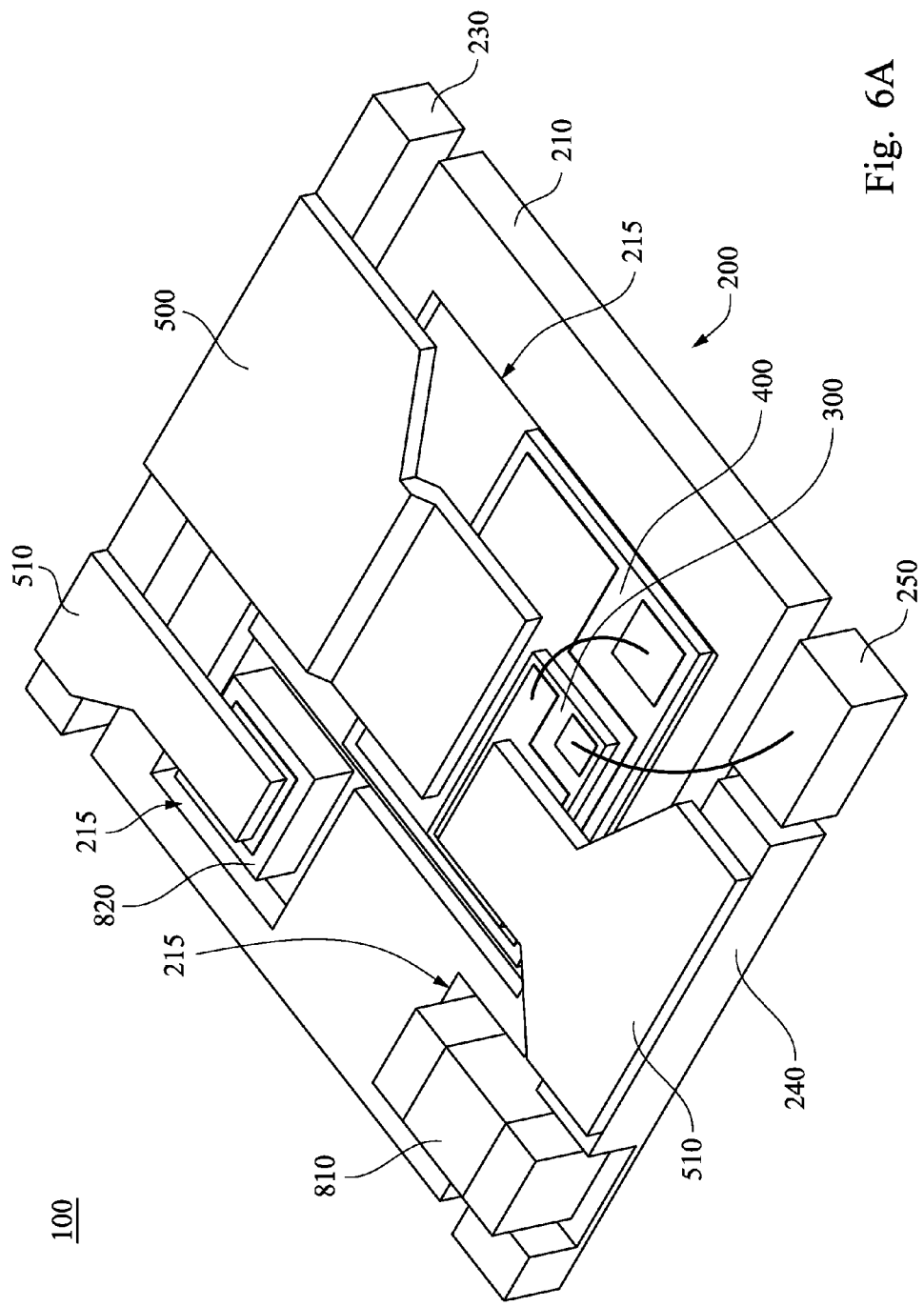
FIG. 6A and FIG. 6B are an oblique view and a cross-sectional view of yet another embodiment of the semiconductor device of the invention.
Figure 6B:
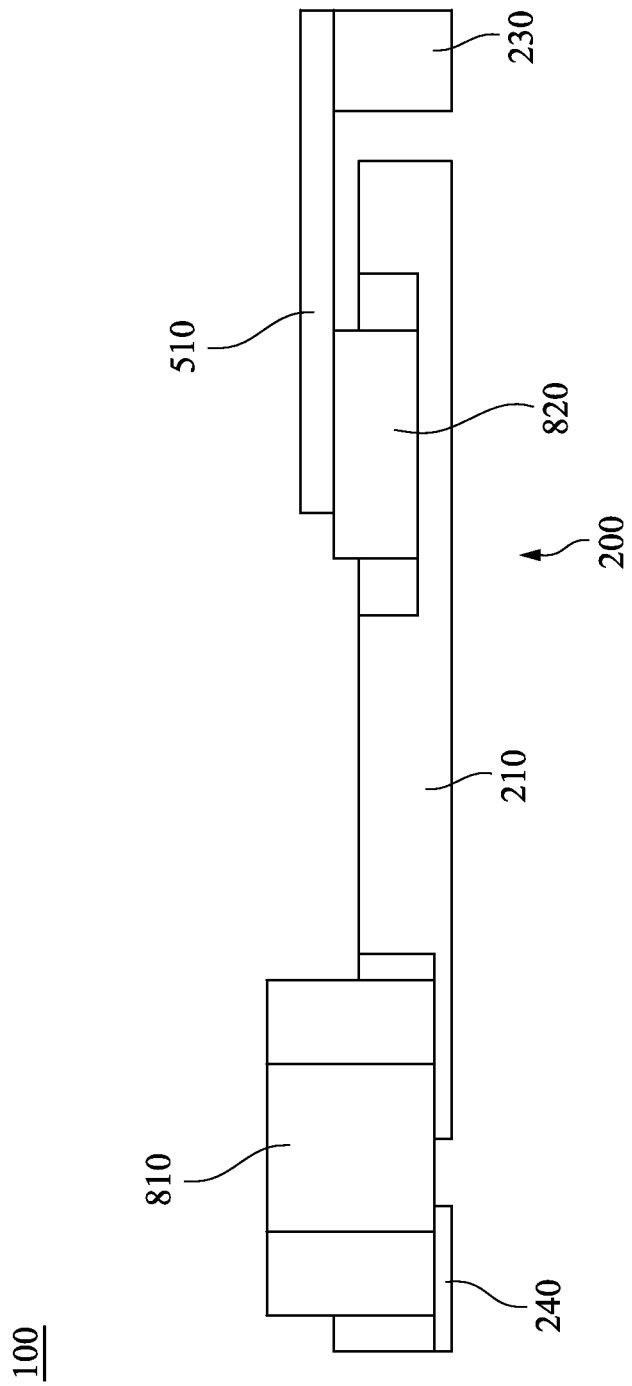

Reference is made to FIG. 6A and FIG. 6B. FIG. 6A and FIG. 6B are an oblique view and a cross-sectional view of yet another embodiment of the semiconductor device of the invention. The semiconductor device 100 includes the lead frame 200, the first semiconductor component 300, the second semiconductor component 400, a plurality of conductive members 500, 510, and 520, and a first passive component 810 and a second passive component 820.

The lead frame 200 includes the first segment 210, the third segment 230, the fourth segment 240, and the fifth segment 250. The first segment 210 has a plurality of recessions 215 for receiving the first semiconductor component 300, the second semiconductor component 400, the first passive component 810, and the second passive component 820. The third segment 230, the fourth segment 240 and the fifth segment 250 are arranged next to and are spatially isolated from each other.

In this embodiment, both the first semiconductor component 300 and the second semiconductor component 400 are vertical components. The first semiconductor component 300 is stacked on the second semiconductor component 400. An electrode at the bottom side of the first semiconductor component 300 contacts to one of the electrodes at the top side of the second semiconductor component 400. Two electrodes of the first passive components 810 respectively connect to the first segment 210 and the fourth segment 240. An electrode of the second passive component 820 contacts the first segment 210.

The conductive members 500, 510, and 520 are metal plates. The conductive member 500 is the metal plate with a drop section. The conductive member 500 connects the third segment 230 to the second semiconductor component 400. The conductive members 510 and 520 are flat metal plates. The conductive member 510 connects third segment 230 to another electrode of the second passive component 820. The conductive member 520 connects the first semiconductor component 300 to the fourth segment 240. The first semiconductor component 300 and the second semiconductor component 400 can be further connected to the fifth segment 250. Comparing to using the wire for interconnection, using metal plate as the conductive member for interconnection may reduce the height of the semiconductor device.

Although the foregoing description of the embodiments of present invention and their advantages have been described in considerable detail with reference to certain embodiments thereof for purposes of illustration and description, they are not intended to be exhaustive or to limit the invention to the precise form or to exemplary embodiments disclosed. It should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. It will be apparent to those skilled in the art that various modifications and variations can be made to the structure of the present invention without departing from the scope or spirit of the invention. Accordingly, the appended claims are intended to include within their scope such processes, machines, manufacture, compositions of matter, means, methods, or steps. Moreover, no element and component in the present disclosure is intended to be dedicated to the public regardless of whether the element or component is explicitly recited in the following claims.

What is claimed is:

1. A semiconductor device comprising:
   a lead frame comprising a first segment and a second segment arranged side by side with the first segment, wherein the first segment is spatially isolated from the second segment;
   a first semiconductor component having a top side and a bottom side, wherein the bottom side of the first semiconductor component is disposed on the first segment;
   a second semiconductor component having a top side and a bottom side, wherein the second semiconductor component is thicker than the first semiconductor component, and the bottom side of the second semiconductor component is disposed on the second segment; and
   a first conductive member electrically connecting the second semiconductor component to the first segment, wherein the top side of the first semiconductor component and the top side of the second semiconductor component are substantially at the same level.

2. The semiconductor device of claim 1, wherein the first semiconductor component is a vertical component, and the second semiconductor component is a lateral component.

3. The semiconductor device of claim 1, wherein the first conductive member is a metal plate.

4. The semiconductor device of claim 1, wherein the first conductive member is unitarily formed with the first segment.

5. The semiconductor device of claim 1, further comprising:
   a third segment disposed next to and spatially isolated from the second segment; and
   a second conductive member electrically connecting the third segment to the second conductor component.

6. The semiconductor device of claim 5, further comprising:
   a fourth segment disposed next to and spatially isolated from the first segment; and
   a third conductive member electrically connecting the fourth segment to the first semiconductor component.

7. The semiconductor device of claim 6, further comprising a sealant sealing the first semiconductor component and the second semiconductor component, wherein at least one of the first segment, the second segment, the third segment, the fourth segment, the first conductive member, the second conductive member, and the third conductive member is at least partially exposed by the sealant.

8. The semiconductor device of claim 6, wherein the second conductive member and the third conductive member are metal plates.

9. The semiconductor device of claim 6, wherein the first conductive member, the second conductive member, and the third conductive member are substantially at the same level.

10. The semiconductor device of claim 1, wherein the lead frame is made of metal or alloy.

11. A semiconductor device comprising:
    a lead frame comprising a first segment and a second segment arranged side by side and being spatially isolated from each other, wherein the first segment comprises a first pad portion and a second pad portion with a level relatively high compared to a level of the first pad portion, and the first pad portion is thicker than the second segment;
    a first semiconductor component having a top side and a bottom side, wherein the bottom side of the first semiconductor component is disposed on the first pad portion of the first segment;
    a second semiconductor component having a top side and a bottom side, wherein the bottom side of the second semiconductor component is disposed on the second segment;
    a first conductive member disposed on the second pad portion of the first segment and the top side of the second semiconductor component; and
    a second conductive member disposed on the top side of the second semiconductor component, wherein the second conductive member is separated from the first conductive member.

12. The semiconductor device of claim 11, wherein the first semiconductor component is a vertical component, and the second semiconductor component is a lateral component.

13. The semiconductor device of claim 11, wherein the second semiconductor component comprises a source electrode, a gate electrode, and a drain electrode, and the first conductive member is electrically connected to at least one of the source electrode, the gate electrode, and the drain electrode of the second semiconductor component.

14. The semiconductor device of claim 11, wherein the first conductive member and the second conductive member are metal plates.

15. The semiconductor device of claim 11, wherein the lead frame comprises a third segment disposed next to and spatially isolated from the second segment, and the second conductive member is connected to the third segment and the second semiconductor component.

16. The semiconductor device of claim 15, further comprising:
    a fourth segment disposed next to and spatially isolated from the first segment; and
    a third conductive member electrically connecting the fourth segment to the first semiconductor component.

17. The semiconductor device of claim 16, wherein the third conductive member is a metal plate, and the first conductive member, the second conductive member, and the third conductive member are substantially at the same level.

18. The semiconductor device of claim 16, further comprising a sealant sealing the first semiconductor component and the second semiconductor component, wherein at least one of the first segment, the second segment, the third segment, the fourth segment, the first conductive member, the second conductive member, and the third conductive member is at least partially exposed by the sealant.

19. The semiconductor device of claim 11, wherein the first conductive member is unitarily formed with the first segment.

* * * * *